United States Patent
Kim

(10) Patent No.: US 11,558,987 B2
(45) Date of Patent: Jan. 17, 2023

(54) RADAR APPARATUS

(71) Applicant: HL KLEMOVE CORP., Incheon (KR)

(72) Inventor: KwanHo Kim, Gyeonggi-do (KR)

(73) Assignee: HL KLEMOVE CORP., Incheon (KR)

( * ) Notice: Subject to any disclaimer, the term of this patent is extended or adjusted under 35 U.S.C. 154(b) by 0 days.

(21) Appl. No.: 17/361,318

(22) Filed: Jun. 29, 2021

(65) Prior Publication Data

US 2021/0410344 A1    Dec. 30, 2021

(30) Foreign Application Priority Data

Jun. 30, 2020   (KR) ........................ 10-2020-0079939

(51) Int. Cl.
*H05K 9/00* (2006.01)
*H05K 1/02* (2006.01)
*G01S 7/03* (2006.01)
*G01S 7/02* (2006.01)
*H05K 5/00* (2006.01)

(52) U.S. Cl.
CPC ............ *H05K 9/0083* (2013.01); *G01S 7/028* (2021.05); *G01S 7/03* (2013.01); *H05K 1/0243* (2013.01); *H05K 5/0004* (2013.01); *H05K 9/0024* (2013.01)

(58) Field of Classification Search
CPC .................................................. H05K 9/0033
See application file for complete search history.

(56) References Cited

U.S. PATENT DOCUMENTS

| | | | |
|---|---|---|---|
| 5,596,487 A * | 1/1997 | Castaneda ............ | H05K 9/0033 174/DIG. 35 |
| 2002/0025720 A1* | 2/2002 | Bright ................ | H01R 13/6586 439/541.5 |
| 2017/0318713 A1* | 11/2017 | Bang ..................... | H05K 9/0083 |

FOREIGN PATENT DOCUMENTS

| | | |
|---|---|---|
| KR | 10-2017-0036350 | 4/2017 |
| KR | 10-2017-0061426 | 6/2017 |
| KR | 10-2019-0114809 | 10/2019 |
| KR | 10-2090767 | 5/2020 |
| WO | 2017/109878 | 6/2017 |

OTHER PUBLICATIONS

Office Action dated Aug. 17, 2021 for Korean Patent Application No. 10-2020-0079939 and its English translation provided by the Applicant's foreign counsel.

* cited by examiner

*Primary Examiner* — Hung V Ngo
(74) *Attorney, Agent, or Firm* — Ladas & Parry, LLP

(57) ABSTRACT

The present disclosure relates to a radar apparatus including a circuit board provided inside a housing having an upper side open, and on which an RF element is mounted on an upper surface, and a cavity having an open lower side and coupled to the upper surface of the circuit board for accommodating the RF element, wherein the cavity includes a coupling portion extending downwardly in a region of a surface coupled to the circuit board, and the coupling portion is inserted into a coupling hole formed in the circuit board to contact a ground plane of the circuit board.

17 Claims, 8 Drawing Sheets

RADAR APPARATUS

CROSS REFERENCE TO RELATED APPLICATION

This application claims priority from Korean Patent Application No. 10-2020-0079939, filed on Jun. 30, 2020, which is hereby incorporated by reference for all purposes as if fully set forth herein.

TECHNICAL FIELD

An embodiment of the present disclosure relates to a radar apparatus to prevent electrostatic discharge that may be caused by external electromagnetic waves.

BACKGROUND

A radar apparatus is a sensor for detecting a surrounding target, and is widely used in various fields such as the civilian field and the military field. Such a radar apparatus is mounted on a vehicle, an aircraft, etc., and may be used by fusion with various application technologies.

For example, in the case that a radar device is mounted on a vehicle, the radar device detects a nearby obstacle, such as a vehicle in front of the vehicle, a pedestrian, and the like, and the control system of the vehicle may utilize the detection result of the radar device to control the vehicle to avoid the obstacle. Alternatively, the vehicle-mounted radar device may detect the preceding vehicle, and the vehicle control system may control the vehicle to follow the preceding vehicle by using the detection result of the radar device.

To this end, the radar device detects the distance between the vehicle and the surrounding object by emitting electromagnetic waves and receiving the reflected electromagnetic waves.

The radar device includes an RF element and an antenna, and electromagnetic waves may be transmitted/received through the antenna. In this case, there may be provided a cavity covering the RF element in order to prevent noise from being generated due to electromagnetic waves being transmitted to the RF element. However, due to an electrostatic discharge (ESD) phenomenon occurring outside the radar device, there may occur a case in which the charge passing through the cavity is conducted to the RF element which is a conductor.

Accordingly, there is increasing the need for a method for solving the degradation of the performance of the radar device due to the discharge phenomenon occurring outside the radar device.

SUMMARY

In this background, embodiments of the present disclosure may provide a radar apparatus capable of removing electric charges conducted to a cavity by extending a coupling portion to contact a ground plane of the circuit board in one region of the cavity.

In accordance with an aspect of the present disclosure, there is provided with a radar apparatus including a circuit board provided inside a housing having an upper side open, and on which an RF element is mounted on an upper surface, and a cavity having an open lower side and coupled to the upper surface of the circuit board for accommodating the RF element, wherein the cavity includes a coupling portion extending downwardly in a region of a surface coupled to the circuit board, and the coupling portion is inserted into a coupling hole formed in the circuit board to contact a ground plane of the circuit board.

According to embodiments of the present disclosure, it is possible to provide a radar apparatus capable of implementing ESD robustness effect by removing electric charge conducted to the cavity by forming a coupling portion extended to contact the ground plane of the circuit board in one area of the cavity.

DETAILED DESCRIPTION

Figure 1:
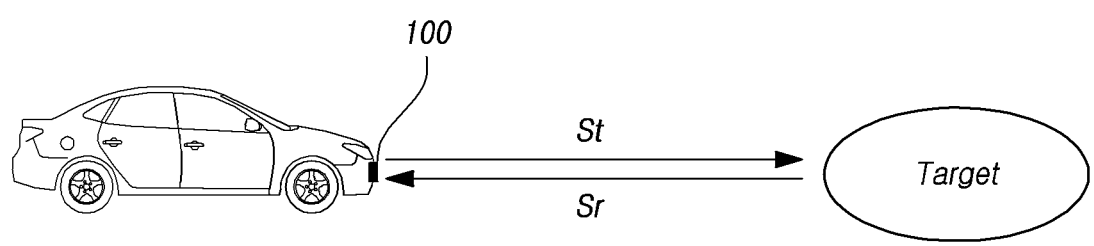
FIG. 1 illustrates a state in which a radar apparatus according to an embodiment of the present disclosure is mounted on a vehicle.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear.

The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, it will be described a radar apparatus according to embodiments in detail with reference to the drawings.

FIG. 1 illustrates a state in which a radar apparatus 100 according to an embodiment of the present disclosure is mounted on a vehicle.

Referring to FIG. 1, the radar apparatus 100 according to the present embodiments may be mounted on a vehicle or the like to detect the presence or location of a target in front of the vehicle or to detect a distance from the target.

In the present disclosure, it is assumed that such a radar apparatus 100 is provided in a vehicle. However, the radar apparatus 100 may be mounted on the front, rear, and side surfaces of various transportations or moving means (e.g., two-wheeled vehicle, train, subway train, aircraft, etc.) as well as a vehicle. Even in this case, the radar apparatus 100 may operate substantially the same as described below.

Further, the target to be detected by the radar apparatus 100 may be an arbitrary target (e.g., a vehicle, a person, an object, etc.) in the vicinity or a specific target.

Referring to FIG. 1, the radar apparatus 100 may emit a transmission signal St in the form of an electromagnetic wave, receive a reception signal Sr in which the emitted transmission signal St hits a target and returns, and detect the presence or location of a target or detect a distance to the target based on the reception signal Sr.

A process of the radar apparatus 100 for detecting the presence or location of a target or detecting a distance to the target may include signal detection processing for the reception signal Sr, signal processing for the detected reception signal Sr, and signal analysis processing, and the like.

The radar apparatus 100 according to the present embodiments may include at least one transmission antenna to radiate the transmission signal St, and at least one receiving antenna to receive the reception signal Sr. According to an example, the transmission antenna may be implemented as an array antenna and arranged in the first direction. In this case, the receiving antenna may also be implemented as an array antenna and may be arranged in a first direction or may be arranged in a second direction perpendicular to the first direction. The difference between an absolute value of the arrangement interval of the transmission antennas and the receiving antennas may be configured to be between 0.5 and 0.75 wavelengths. In addition, the interval between the transmission antenna and the receiving antenna may be configured to be greater than one wavelength. However, this is not limited thereto, and the transmission antenna and the receiving antenna may be implemented in various types and forms as needed.

Figure 2:
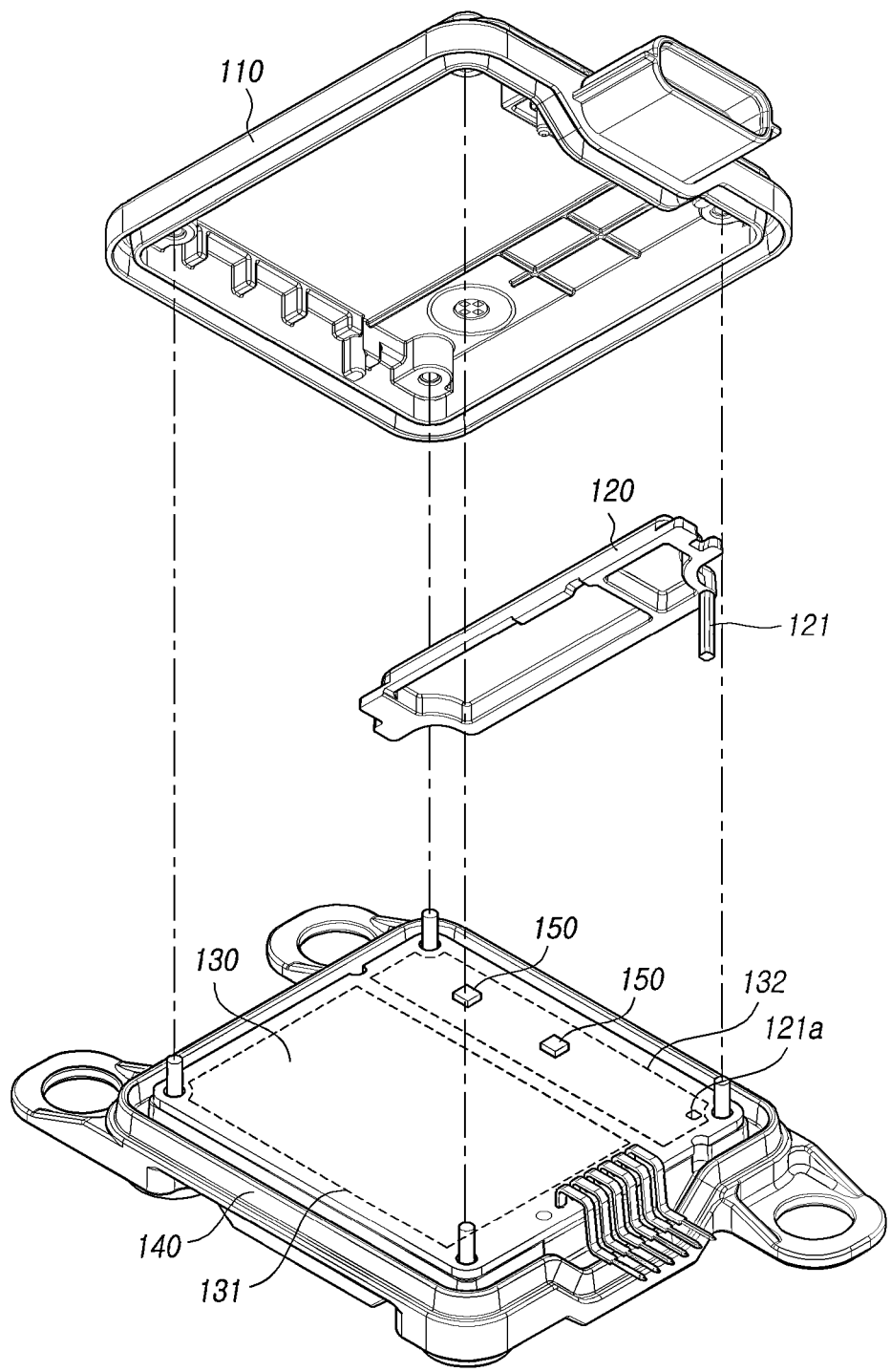
FIG. 2 is an exploded perspective view of a radar apparatus according to an embodiment of the present disclosure.
Figure 3:
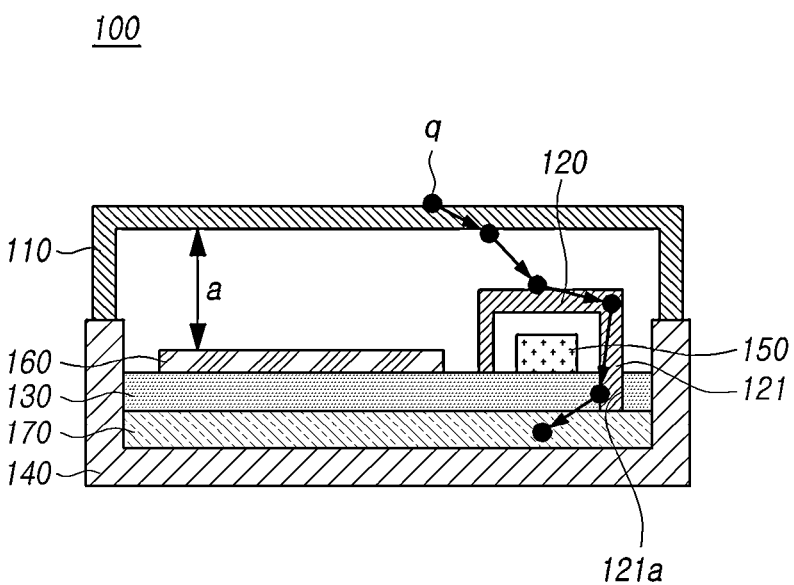
FIG. 3 is a cross-sectional view of a coupling state of a radar apparatus according to an embodiment of the present disclosure.

FIG. 2 is an exploded perspective view of a radar apparatus 100 according to an embodiment of the present disclosure. FIG. 3 is a cross-sectional view of a coupling state of a radar apparatus according 100 to an embodiment of the present disclosure.

Referring to FIG. 2, the radar apparatus 100 may include a circuit board 130 provided inside a housing 140 having an upper side open, and on which an RF element 150 is mounted on an upper surface, and a cavity 120 having an open lower side and coupled to the upper surface of the circuit board 130 for accommodating the RF element 150. The arrangement and shape of a radome 110, the cavity 120, the circuit board 130, the housing 140 and the RF element 150 illustrated in FIG. 2 is an example, and is not limited thereto. Each component of the radar apparatus 100 is not limited to a specific arrangement or shape, as long as the technical spirit described in the present disclosure can be applied substantially the same.

In addition, referring to FIG. 3, the radar apparatus 100 may include a radome 110, a cavity 120, a circuit board 130, a housing 140 and an RF element 150, and may further include an antenna 160 and a shield can 170.

The housing 140 has an upper side open and the circuit board 130 is seated therein. The radome 110 is coupled to the housing 140, and electromagnetic waves transmitted and received from the antenna 160 are transmitted through the radome 201.

The radome 110 may be made of a material through which electromagnetic waves can be transmitted so that the signal radiated from the antenna 160 is transmitted to the outside, and reflected from the target to be received. That is, the radome 110 is made of a material that passes electromagnetic waves, such as plastic including, for example, PBT(+ASA)–GF30, etc., so that loss of electromagnetic waves transmitted and received through the radome 110 can be minimized. However, this is an example and is not limited thereto. Also, according to an example, the radome 110 may be configured as a front and rear bumper, a grille, a side body of a vehicle, or an outer surface of a vehicle component.

The circuit board 130 may include, on the upper side thereof, a first region 131 in which the antenna 160 is mounted and a second region 132 in which the RF element 150 is mounted. The shapes of the first region 131 and the second region 132 illustrated in FIG. 2 are examples, and are not limited thereto. The corresponding regions may be implemented differently depending on the mounting shape of the antenna 160 and the RF element 150. According to an example, the circuit board 130 may be implemented as a printed circuit board (PCB). However, this is an example and is not limited thereto.

The shield can 170 may be provided between the circuit board 130 and the housing 140. The shield can 170 may shield electromagnetic waves caused by components provided in the radar apparatus 100. The shield can may be made of a metal material and may be formed in a structure for dissipating electromagnetic waves. According to an example, the shield can 170 may be directly soldered to the ground portion on the circuit board 130 to shield electromagnetic waves.

The RF element 150 may process electromagnetic waves transmitted and received through the antenna 160 and transmit an electric signal to a controller of the radar apparatus 100. Although it is illustrated that two RF elements are mounted in FIG. 2, this is an example and is not limited thereto, and may be provided in one or three or more elements.

The antenna 160 may be mounted in the first region 131 separated from the second region 132 in which the RF element 150 is mounted among the upper surface of the circuit board 130. The antenna 160 may include at least one transmission antenna for radiating a transmission signal and at least one receiving antenna for receiving a reception signal.

According to an example, the transmission antenna and the receiving antenna may be designed in various antenna structures and antenna shapes. For example, the antenna 160 may be designed in the form of an array antenna including a plurality of antenna elements. Alternatively, the antenna 160 may be designed in the form of a microstrip antenna or a patch antenna.

The cavity 120 may reflect or absorb electromagnetic waves from the outside at the upper side and the side to prevent the electromagnetic waves from being transmitted to the RF element 150 from generating noise. The cavity 120 may be coupled to the second region 132 to cover the RF element 150 without overlapping the first region 131. That is, the cavity 120 is formed in a concave structure inside, so that the RF element 150 is provided between the circuit board 130 and the cavity 120. Accordingly, a space may be formed between the cavity 120 and the RF element 150.

According to an example, the cavity 120 may be formed of a polymer resin containing conductive powder to shield electromagnetic waves from the outside. In this case, the polymer resin may be, for example, silicone, polypropylene, polyvinyl alcohol, nylon, polyurethane, or a mixture thereof. In addition, silver or silver-coated copper may be used as the conductive powder. Alternatively, according to an example, the cavity 120 may be made of plastic including carbon fibers and carbon nanotubes. Alternatively, according to an example, the cavity 120 may be made of a metal material. However, this is an example, and as long as it is a material capable of shielding electromagnetic waves and preventing electrostatic discharge according to the present disclosure, it is not limited to a specific material.

Referring to FIG. 2, the cavity 120 may include a coupling portion 121 extending downwardly in one region of a surface coupled to the circuit board 130.

In FIG. 2, the coupling portion 121 is illustrated to extend in a vertical direction on one surface of the cavity 120, but is not limited thereto, and may be formed in other directions such as an oblique direction. In addition, although the coupling portion is illustrated in the form of a square pillar in FIG. 2, this is an example, and the shape of the coupling portion may be formed differently as needed.

The coupling portion 121 may be inserted into the coupling hole 121a formed in the circuit board 130 to contact the ground plane of the circuit board 130. In FIG. 2, the coupling portion 121 is illustrated as being formed in the corner region, but it is not limited thereto, and the formation position of the coupling portion 121 may be determined differently if necessary.

In FIG. 2, the coupling portion 121 is illustrated to be inserted into the coupling hole 121a, but this is an example and is not limited thereto. According to another example, a coupling groove is formed on the side surface of the circuit board 130, and the coupling portion 121 may be implemented in the form of being fitted into the coupling groove.

Referring to FIG. 3, it is illustrated the path through which the electric charge q is moved by electromagnetic waves from the outside. In the case of a conventional cavity, a path of moving charges moved to the cavity is not secured, so there is a possibility that an electrostatic discharge effect may occur in the RF element inside the cavity. However, in the case of the radar apparatus 100 according to the present disclosure, the coupling portion 121 is formed to protrude from the cavity 120 and is coupled to the ground plane of the circuit board 130, so that the charge in the cavity 120 may be transferred to the ground plane through the cavity.

Accordingly, it is possible to prevent the electric charge in the cavity 120 from causing an electrostatic discharge effect in the RF element 150.

In addition, according to an example, the outer surface of the coupling portion 121 in contact with the coupling hole 121a may be coated with an insulating material in order to minimize the effect of charge transfer.

Accordingly, it is possible to provide a radar apparatus capable of implementing an ESD robustness effect by removing charges conducted to the cavity by forming a coupling portion extending in contact with the ground plane of the circuit board in a region of the cavity.

Hereinafter, it will be described other embodiments of the radar apparatus 100 according to the present disclosure with reference to the related drawings. Although description of overlapping parts in the description of the above-described radar apparatus 100 is omitted, the same may be applied to the embodiments described below as long as it is not against the technical idea. In addition, the embodiments described in the present disclosure may be implemented independently or in combination with each other.

Figure 4:
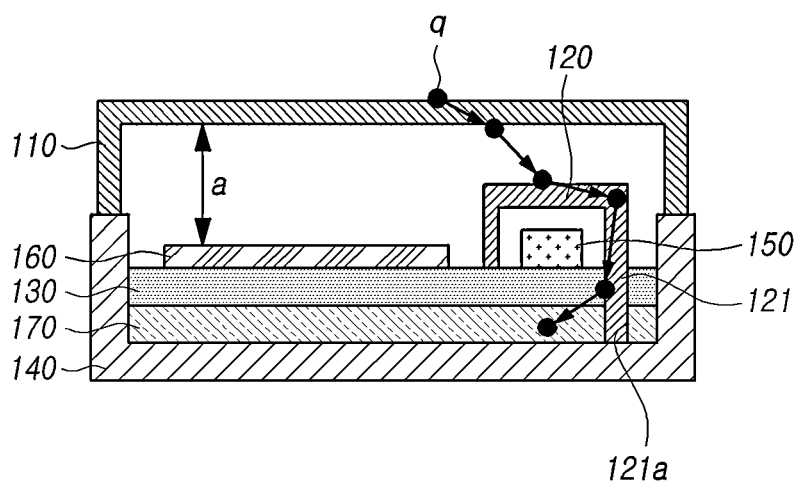
FIG. 4 is a diagram for explaining a cavity in which a coupling portion extends to a housing according to an embodiment of the present disclosure.

FIG. 4 is a diagram for explaining a cavity in which a coupling portion extends to a housing according to an embodiment of the present disclosure.

Referring to FIG. 4, the coupling hole 121a formed in the circuit board 130 may extend through the shield can 170 to the housing 140. Accordingly, the length of the coupling portion 121 formed in the cavity 120 may be longer than that of the embodiment illustrated in FIG. 3. Accordingly. The coupling portion 121 may pass through the shield can 170 and be inserted into the coupling hole 121a extending to the housing 140 to be in contact with the housing 140.

According to an example, the housing 140 may include a ground portion at a portion that the coupling portion 121 is in contact with. In this case, the electric charge in the cavity 120 may move to the ground plane of the circuit board 130 and the ground portion of the housing 140 through the coupling portion 121. Accordingly, it is possible to further enhance the electrostatic discharge prevention effect.

Figure 5:
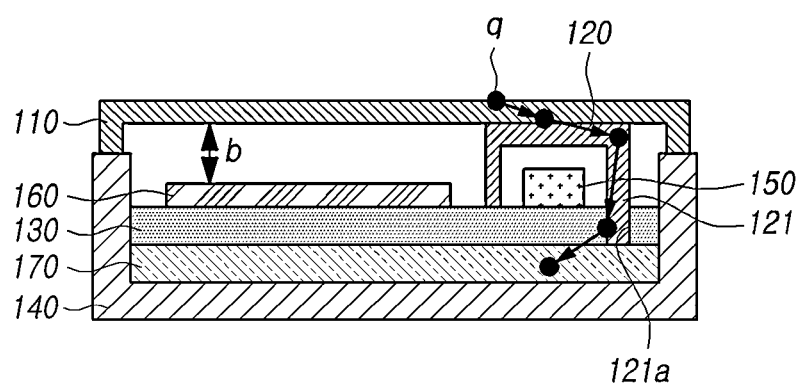
FIG. 5 is a diagram for describing a radar apparatus in which a cavity is coupled to a radome according to an embodiment of the present disclosure.

FIG. 5 is a diagram for describing a radar apparatus in which a cavity is coupled to a radome according to an embodiment of the present disclosure.

Referring to FIG. 5, according to an example, the cavity 120 may have an upper surface coupled to a lower surface of the radome 110. Alternatively, according to another example, the cavity 120 may be manufactured integrally with the radome 110.

In this case, the distance "b" between the radome 110 and the antenna 160 is shorter than the distance "a" between the radome 110 and the antenna 160 according to the embodiment of FIGS. 3 and 4. Therefore, the gain value of the signal transmitted and received by the antenna 160 may be increased. Accordingly, it is possible to increase the value of the antenna gain while securing the effect of preventing electrostatic discharge.

However, according to this embodiment, there may be reduced the effect of the dielectric strength due to the air between the radome 110 and the cavity 120. Accordingly, the distance "b" between the radome 110 and the antenna 160 may be adjusted in consideration of the effects of the increased antenna gain and the decreased dielectric strength.

Figure 6:
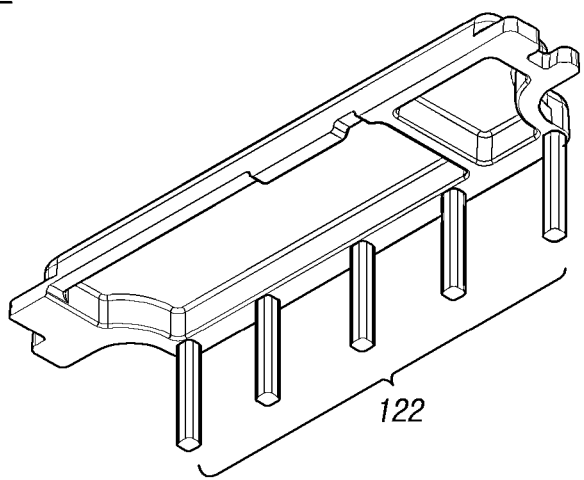
FIG. 6 is a diagram for explaining a cavity including a plurality of coupling portions according to an embodiment of the present disclosure.

FIG. 6 is a diagram for explaining a cavity including a plurality of coupling portions according to an embodiment of the present disclosure.

Referring to FIG. 6, a plurality of coupling portions 122 formed in the cavity 120 may be spaced apart from each other at a predetermined interval. Accordingly, a plurality of coupling holes 121a formed in the circuit board 130 may also be formed to correspond to the number of coupling portions 122.

In FIG. 6, it is illustrated a case where the number of the coupling portions 122 is 5, however, this is an example and is not limited thereto. The number of coupling portions 122 may be formed differently, if necessary.

In addition, although it is illustrated in FIG. 6 that the separation distance and the formation region of the coupling portion 122 are uniformly disposed with each other, it is not limited thereto. The spacing between the coupling portions 122 is not necessarily uniform, and the size of the region of the coupling portions does not need to be the same.

Accordingly, there may be secured a plurality of movement paths of electric charges, and thus the effect of preventing electrostatic discharge may be further strengthened.

Figure 7:
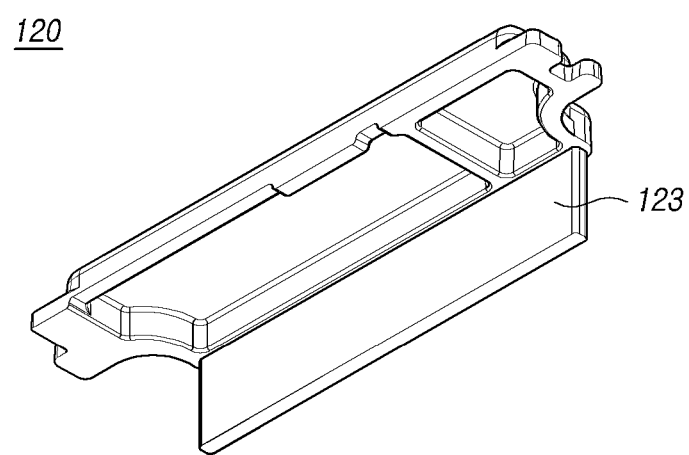
FIG. 7 is a diagram for explaining a cavity in which a coupling portion is formed in a plate shape according to an embodiment of the present disclosure.

FIG. 7 is a diagram for explaining a cavity in which a coupling portion is formed in a plate shape according to an embodiment of the present disclosure.

Referring to FIG. 7, the coupling portion 123 in the cavity 120 may be formed in a plate shape along one surface of the cavity 120. Accordingly, the coupling holes 121a in the circuit board 130 may also be formed in a shape into which the plate-shaped coupling portions 123 can be inserted corresponding to the shape of the coupling portions 123.

Accordingly, the movement path of electric charges can be secured widely, so that it is possible to further secure the electrostatic discharge prevention effect.

Figure 8:
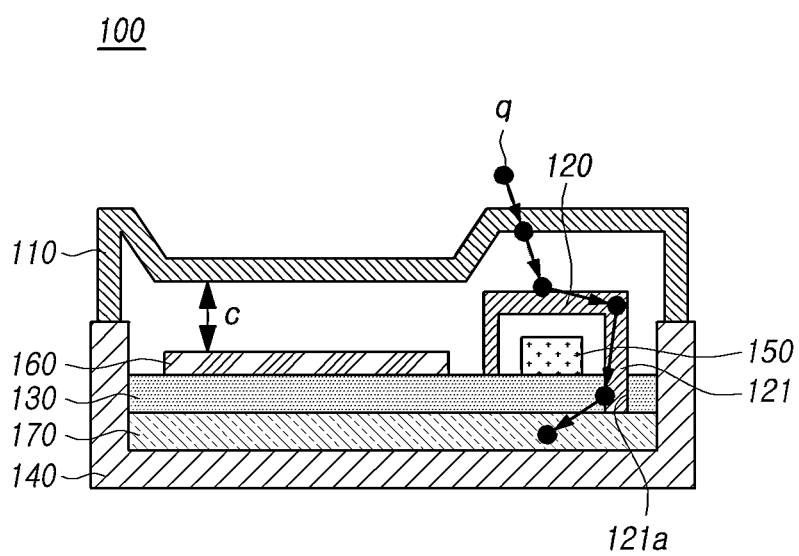
FIG. 8 is a diagram for explaining a radome formed by inwardly protruding region according to an embodiment of the present disclosure.

FIG. 8 is a diagram for explaining a radome formed by inwardly protruding region according to an embodiment of the present disclosure.

Referring to FIG. 8, the radome 110 may be formed so that an area corresponding to the first region 131 on which the antenna 160 is mounted protrudes in the direction of the antenna 160.

In this case, the distance "c" between the radome 110 and the antenna 160 is shorter than the distance "a" between the radome 110 and the antenna 160 according to the embodiment of FIGS. 3 and 4. Therefore, the gain value of the signal transmitted and received by the antenna 160 may be increased. Accordingly, it is possible to increase the value of the antenna gain while deriving the effect of preventing electrostatic discharge.

According to an example, the protruding region of the radome 110 may be formed such that the distance "c" to the antenna 160 is half a wavelength with respect to the wavelength of the signal transmitted from the antenna 160. This is because the signal loss due to the radome 110 may be the smallest when the distance between the antenna 160 and the radome 110 is half the wavelength of the center frequency of the antenna. Accordingly, while the loss of the signal from the antenna 160 is minimized, the electrostatic discharge prevention effect can be derived.

Accordingly, it is possible to provide a radar apparatus capable of implementing an ESD robustness effect by removing electric charges conducted to the cavity by extending the coupling portion to contact the ground plane of the circuit board in one region of the cavity.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A radar apparatus comprising:
a circuit board disposed inside a housing having an upper side open, wherein an RF element is mounted on an upper surface of the circuit board;
a cavity having an open lower side and coupled to the upper surface of the circuit board for accommodating the RF element; and
a shield can disposed between the circuit board and the housing,
wherein the cavity includes a coupling portion extending downwardly in a region of a surface coupled to the circuit board, and the coupling portion is inserted into a coupling hole formed in the circuit board to contact a ground plane of the circuit board, and
wherein the coupling portion is inserted into the coupling hole formed extending to the housing through the shield can and extends to contact the housing.

2. The radar apparatus of claim 1, wherein a space is formed between the cavity and the RF element.

3. The radar apparatus of claim 1, wherein the cavity is formed of a polymer resin containing conductive powder to shield electromagnetic waves from an outside.

4. The radar apparatus of claim 1, further comprising a radome with an open lower side and coupled to the housing.

5. The radar apparatus of claim 4, wherein an upper surface of the cavity is coupled to a lower surface of the radome.

6. The radar apparatus of claim 4, further comprising an antenna mounted on a region separated from a region on which the RF element is mounted among the upper surface of the circuit board,
wherein the radome is formed so that a region corresponding to a region in which the antenna is mounted protrudes in a direction of the antenna.

7. The radar apparatus of claim 6, wherein a distance to the antenna of the protruding area of the radome corresponds to a half-wavelength with respect to a wavelength of signal transmitted from the antenna.

8. The radar apparatus of claim 1, wherein a plurality of the coupling portions are spaced apart from each other at a predetermined interval, and a plurality of the coupling holes are formed to correspond to the coupling portion.

9. The radar apparatus of claim 1, wherein the coupling portion is formed in the form of a plate, and the coupling hole is formed in a shape into which the plate-shaped coupling portion is inserted.

10. A radar apparatus comprising:
a circuit board disposed inside a housing having an upper side open, wherein an RF element is mounted on an upper surface of the circuit board;
a cavity having an open lower side and coupled to the upper surface of the circuit board for accommodating the RF element;
a radome with an open lower side and coupled to the housing;
an antenna mounted on a region separated from a region on which the RF element is mounted among the upper surface of the circuit board,
wherein the cavity includes a coupling portion extending downwardly in a region of a surface coupled to the circuit board, and the coupling portion is inserted into a coupling hole formed in the circuit board to contact a ground plane of the circuit board, and
wherein a distance to the antenna of the protruding area of the radome corresponds to a half-wavelength with respect to a wavelength of signal transmitted from the antenna.

11. The radar apparatus of claim 10, wherein a space is formed between the cavity and the RF element.

12. The radar apparatus of claim 10, wherein the cavity is formed of a polymer resin containing conductive powder to shield electromagnetic waves from an outside.

13. The radar apparatus of claim 10, further comprising a shield can disposed between the circuit board and the housing.

14. The radar apparatus of claim 13, wherein the coupling portion is inserted into the coupling hole formed extending to the housing through the shield can and extends to contact the housing.

15. The radar apparatus of claim 10, wherein an upper surface of the cavity is coupled to a lower surface of the radome.

16. The radar apparatus of claim 10, wherein a plurality of the coupling portions are spaced apart from each other at a predetermined interval, and a plurality of the coupling holes are formed to correspond to the coupling portion.

17. The radar apparatus of claim 10, wherein the coupling portion is formed in the form of a plate, and the coupling hole is formed in a shape into which the plate-shaped coupling portion is inserted.

* * * * *